(12) United States Patent
Liu

(10) Patent No.: US 11,567,145 B2
(45) Date of Patent: Jan. 31, 2023

(54) BATTERY MANAGEMENT SYSTEM FOR EARLY DETECTION OF A BATTERY CELL INTERNAL SHORT-CIRCUIT

(71) Applicant: The Boeing Company, Chicago, IL (US)

(72) Inventor: Shengyi Liu, Sammamish, WA (US)

(73) Assignee: The Boeing Company, Chicago, IL (US)

( * ) Notice: Subject to any disclaimer, the term of this patent is extended or adjusted under 35 U.S.C. 154(b) by 16 days.

(21) Appl. No.: 17/373,574

(22) Filed: Jul. 12, 2021

(65) Prior Publication Data

US 2022/0196756 A1 Jun. 23, 2022

Related U.S. Application Data

(60) Provisional application No. 63/127,577, filed on Dec. 18, 2020.

(51) Int. Cl.
| | |
|---|---|
| *G01R 31/00* | (2006.01) |
| *G01R 31/52* | (2020.01) |
| *H02J 7/00* | (2006.01) |
| *G01R 31/3842* | (2019.01) |
| *H01M 10/42* | (2006.01) |
| *H01M 10/48* | (2006.01) |
| *G01R 31/396* | (2019.01) |

(52) U.S. Cl.
CPC ......... *G01R 31/52* (2020.01); *G01R 31/3842* (2019.01); *G01R 31/396* (2019.01); *H01M 10/425* (2013.01); *H01M 10/488* (2013.01); *H02J 7/0047* (2013.01); *H01M 2010/4271* (2013.01); *H02J 7/0029* (2013.01)

(58) Field of Classification Search
USPC .......................................... 324/426, 433–435
See application file for complete search history.

(56) References Cited

U.S. PATENT DOCUMENTS

| | | |
|---|---|---|
| 6,873,134 B2 | 3/2005 | Canter et al. |
| 7,038,426 B2 | 5/2006 | Hall |
| 9,287,726 B2 | 3/2016 | Gao et al. |
| 9,658,146 B2 | 5/2017 | Olson et al. |
| 9,846,199 B2 | 12/2017 | Vian et al. |
| 9,866,050 B2 | 1/2018 | Brandt et al. |
| 10,050,252 B2 | 8/2018 | Becker-Irvin et al. |
| 10,330,739 B2 | 6/2019 | Quiambao et al. |
| 10,651,514 B2 | 5/2020 | Liu et al. |
| 2021/0208208 A1* | 7/2021 | Yazami ............... G01R 31/3835 |
| 2022/0016996 A1* | 1/2022 | Yang ..................... B60L 3/0046 |

OTHER PUBLICATIONS

Moeini et al.; "Fast and Precise Detection of Internal Short Circuit on Li-Ion Battery"; IEEE 2018; pp. 2759-2766.
Yang et al.; "Investigation of Internal Short Circuits of Lithium-Ion Batteries under Mechanical Abusive Conditions" Energies 2019, 12; www.mdpi.com/journal/energies; 16 pages.

\* cited by examiner

*Primary Examiner* — Vincent Q Nguyen
(74) *Attorney, Agent, or Firm* — Haynes and Boone, LLP

(57) ABSTRACT

A battery management system (BMS) for early detection of a battery cell internal short-circuit. The BMS includes a memory, one or more processing units, and a machine-readable medium on the memory. The machine-readable medium stores instructions that, when executed by the one or more processing units, cause the BMS to perform numerous operations of a method for early detection of the battery cell internal short-circuit.

21 Claims, 9 Drawing Sheets

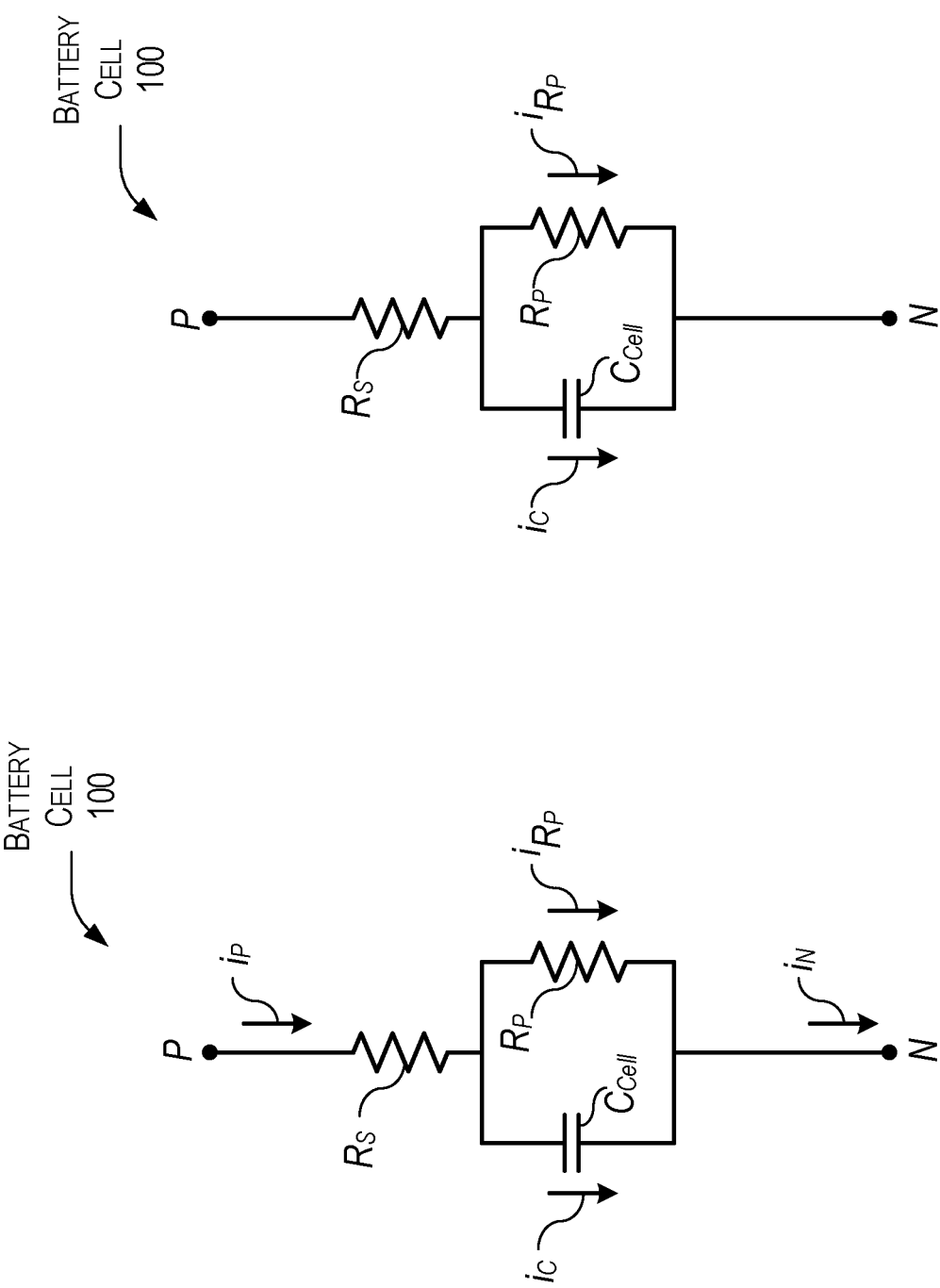

BATTERY MANAGEMENT SYSTEM FOR EARLY DETECTION OF A BATTERY CELL INTERNAL SHORT-CIRCUIT

CROSS REFERENCE TO RELATED APPLICATION

The present invention claims priority to U.S. Provisional Patent Application No. 63/127,577, filed Dec. 18, 2020, which is incorporated herein by reference in its entirety.

BACKGROUND

1. Technical Field

The field of the present disclosure relates generally to battery systems, and more specifically, systems for detecting internal battery short-circuits.

2. Prior Art

In modern society, the use of batteries has become commonplace for portable electronics and electric vehicles, such as electric automobile, trucks, marine vehicles, and aircrafts, and are becoming more common in present society. Generally, Lithium-ion batteries are commonly utilized for some of these portable electronics and most of the electric vehicles. Lithium-ion batteries generally have a high energy density, no memory effect and low self-discharge but can be a safety hazard since they contain flammable electrolytes, and if damaged or incorrectly charged can ignite and cause external damage. Generally, an internal short-circuit (ISC) within a lithium-ion battery cell can produce significant heat in a short period of time, which raises the temperature of the battery cell and can cause permanent damage to or an uncontrollable thermal runaway (i.e., ignition) of the battery cell. ISC within lithium-ion batteries causes significant economic losses worldwide and numerous incidents have been reported.

An ISC occurs within a lithium-ion battery cell due to a short-circuit channel build-up which is a result of a lithium-ion dendritic process. This process is believed to be caused by defect, or by abuse, or by normal degradation. Unfortunately, because the short-circuit in these battery cells resides within the battery cell, it is difficult to directly detect the short-circuit utilizing external sensing circuit parameters of the battery cell (i.e., voltage, current, temperature, state of charge, etc.). As such, an ISC incident may occur within a battery cell either during its operation state or even in its standby state.

Known approaches to detect an ISC include internal resistance detection and temperature detection. The internal resistance detection approach monitors the battery cell internal resistance to detect an ISC. In this approach it is assumed that the battery cell internal resistance becomes infinitely small when an ISC has been built up within the battery cell and the ISC may be detected at the battery cell terminals by measuring the voltage and current where the resistance is equal to the voltage divided by the current from Ohm's law. However, there are a couple of drawbacks with this approach. The first is that the internal resistance of the battery cell is temperature dependent and it becomes higher when the temperature is higher. Therefore, it is difficult to quantify the ISC build-up process by using the internal resistance of the battery cell. Generally, this approach can detect a short-circuit within the battery cell, but it is not good approach for an early detection of that short-circuit. Second, the battery cell internal resistance is also dependent on its charge and/or discharge current level. Therefore, the resistance calculated based on the terminal voltage and current will not be consistent with the actual ISC build-up process. When the battery cell is not active (standby state), the detection of an internal resistance within the battery cell becomes unavailable because the terminal current is zero. However, an ISC may still occur.

The temperature detection approach monitors the battery cell temperature to prevent a thermal runaway caused by an ISC within the battery cell. However, this approach cannot quantify an ISC build-up process either, therefore it does not provide a criteria for early detection of the ISC before a potential catastrophic event happens to the battery cell. As such, there is a need for a system and method that address these problems.

SUMMARY

A battery management system (BMS) for early detection of a battery cell internal short-circuit is disclosed. The BMS comprises a memory, one or more processing units, and a machine-readable medium on the memory. The machine-readable medium stores instructions that, when executed by the one or more processing units, cause the BMS to perform numerous operations of a method for early detection of the battery cell internal short-circuit.

These operations of the method comprise receiving initialization data for the battery cell at a service start time. The initialization data includes a predetermined state of charge (SOC) as a function of time, a predetermined input criteria parameter ($\delta$), a predetermined active state charge loss criteria ($Q_{cri}^{act}$), a predetermined standby state charge loss criteria ($Q_{cri}^{sb}$), and a predetermined battery effective capacity (C) as a function of time. The operations also comprise measuring a terminal current (i) of the battery cell at the service start time and determining if the battery cell is in the active state or the standby state. Moreover, the operations comprise determining a charge flow into the battery cell ($Q_{chr}$) and a charge flow out of the battery cell ($Q_{dis}$) utilizing i if the battery cell is in the active state, determining an active state charge loss ($Q_{loss}^{act}$) at an end of one equivalent charge-discharge cycle utilizing $Q_{chr}$ and $Q_{dis}$, and producing an alarm signal if $Q_{loss}^{act}$ is equal to or greater than $Q_{cri}^{act}$ or, otherwise, advancing a time step, measuring i, and repeating the operation of determining if the battery cell is in the active state or the standby state. Furthermore, the operations comprise periodically monitoring a SOC value of the SOC if the battery cell is in the standby state, determining a standby state charge loss ($Q_{loss}^{sb}$) at the end of each pre-determined period of time ($\tau_2$) utilizing the SOC value, an initial SOC value at a beginning of each period, and the battery effective capacity C at the beginning of each period of time, and producing an alarm signal if $Q_{loss}^{sb}$ is equal to or greater than $Q_{cri}^{sb}$ or, otherwise, advancing the time step, measuring i, and repeating the operation of determining if the battery cell is in the active state or the standby state.

In this example, the battery effective capacity C is subject to degradation during each equivalent charge-discharge cycle or each period of the time of a standby state. Thus, the value of the battery effective capacity C at the end of each cycle or period is updated using the degradation factor (d) and other parameters such as voltage, current, and temperature.

Other devices, apparatuses, systems, methods, features, and advantages of the invention will be or will become apparent to one with skill in the art upon examination of the following figures and detailed description. It is intended that all such additional devices, apparatuses, systems, methods, features, and advantages be included within this description, be within the scope of the invention, and be protected by the accompanying claims.

BRIEF DESCRIPTION OF THE FIGURES

The invention may be better understood by referring to the following figures. The components in the figures are not necessarily to scale, emphasis instead being placed upon illustrating the principles of the invention. In the figures, like reference numerals designate corresponding parts throughout the different views.

FIG. 1A is a system block diagram of an example of a circuit model of an implementation of a battery cell in an active state in accordance with the present disclosure.

FIG. 1B is a system block diagram of an example of the circuit model of the implementation of the battery cell in a standby state in accordance with the present disclosure.

DETAILED DESCRIPTION

Figure 2A:
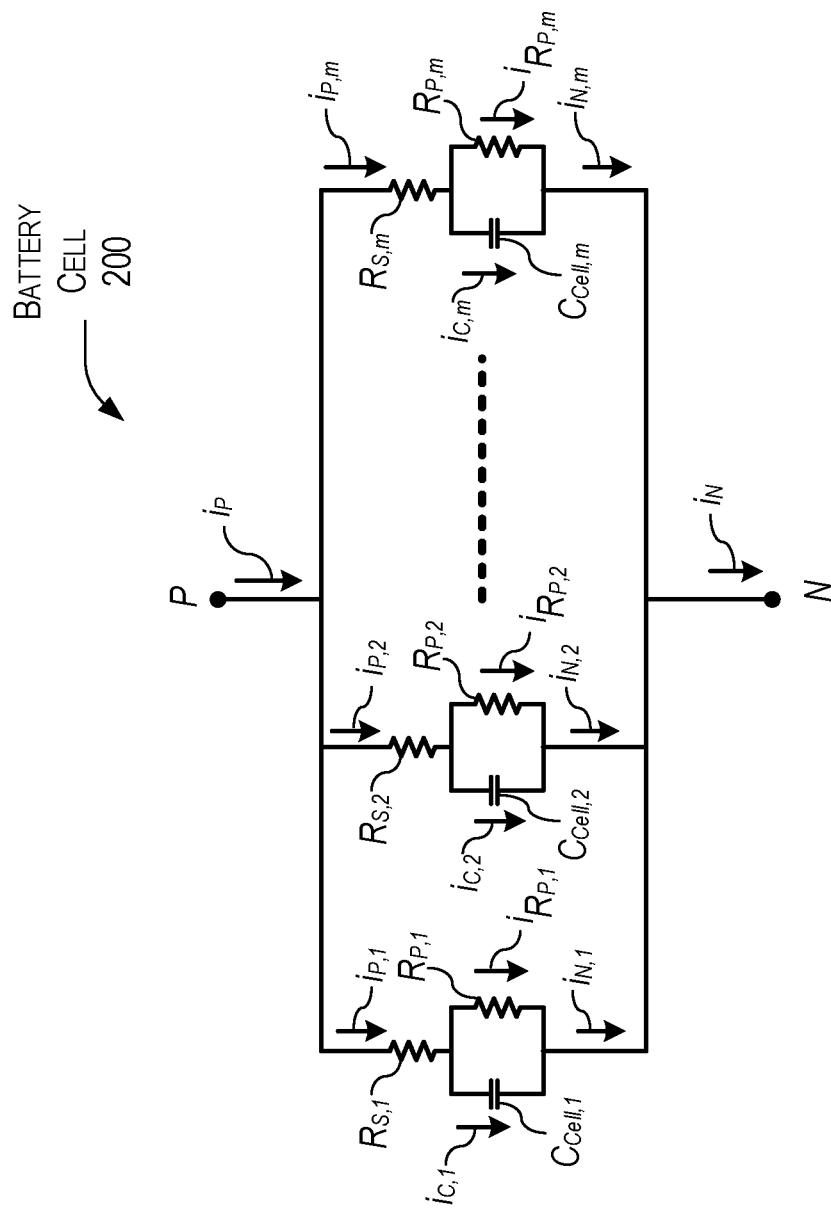
FIG. 2A is a system block diagram of an example of another implementation of a battery cell including a plurality of battery sub-cells in accordance with the present disclosure.

Disclosed is a battery management system (BMS) for early detection of a battery cell internal short-circuit. The BMS comprises a memory, one or more processing units, and a machine-readable medium on the memory. The machine-readable medium stores instructions that, when executed by the one or more processing units, cause the BMS to perform numerous operations of a method for early detection of the battery cell internal short-circuit.

These operations of the method comprise receiving initialization data for the battery cell at a service start time. The initialization data includes a predetermined state of charge (SOC) as a function of time, a predetermined input criteria parameter ($\delta$), a predetermined active state charge loss criteria ($Q_{cri}^{act}$), a predetermined standby state charge loss criteria ($Q_{cri}^{sb}$), and a predetermined battery effective capacity (C) as a function of time. The operations also comprise measuring a terminal current (i) of the battery cell at the service start time and determining if the battery cell is in the active state or the standby state. Moreover, the operations comprise determining a charge flow into the battery cell ($Q_{chr}$) and a charge flow out of the battery cell ($Q_{dis}$) utilizing i if the battery cell is in the active state, determining an active state charge loss ($Q_{loss}^{act}$) at an end of one equivalent charge-discharge cycle utilizing $Q_{chr}$ and $Q_{dis}$, and producing an alarm signal if $Q_{loss}^{act}$ is equal to or greater than $Q_{cri}^{act}$ or, otherwise, advancing a time step, measuring i, and repeating the operation of determining if the battery cell is in the active state or the standby state. Furthermore, the operations comprise periodically monitoring a SOC value of the SOC if the battery cell is in the standby state, determining a standby state charge loss ($Q_{loss}^{sb}$) at the end of each pre-determined period of time ($\tau_2$) utilizing the SOC value, an initial SOC value at a beginning of each period, and the battery effective capacity C at the beginning of each period of time, and producing an alarm signal if $Q_{loss}^{sb}$ is equal to or greater than $Q_{cri}^{sb}$ or, otherwise, advancing the time step, measuring i, and repeating the operation of determining if the battery cell is in the active state or the standby state.

In this example, the battery effective capacity C is subject to degradation during each equivalent charge-discharge cycle or each period of the time of a standby state. Thus, the value of the battery effective capacity C at the end of each cycle or period is updated using the degradation factor (d) and other parameters such as voltage, current, and temperature.

In FIG. 1A, a system block diagram of an example of a circuit model of an implementation of a battery cell 100 in an active state is shown in accordance with the present disclosure. In FIG. 1B, the battery cell 100 is shown in a standby state. In this example, the circuit model of the battery cell 100 is that of a simple battery cell connected between a positive node P and negative node N and includes a capacity of the cell ($C_{Cell}$), an internal series resistance ($R_S$) of the battery cell 100, and a self-discharge resistance ($R_P$) of battery cell 100. In this example, the current flowing ($i_{R_P}$) through the $R_P$ does not contribute to the charge storage of the battery cell 100. Therefore, this portion of the charge in the battery cell 100 is lost. For a typical battery cell 100, $R_P$ is typically of a large resistance and the current $i_{R_P}$ is generally very small. It is appreciated by those of ordinary skill in the art that a self-discharge process in the battery cell 100 always occurs regardless of whether the battery cell 100 is in its active or standby state.

In the active state, shown in FIG. 1A, a current ($i_N$) flowing out of the negative node N is equal to a current ($i_P$) injected into the positive node P. The currents $i_N$ and $i_P$ are also related to the $i_{R_P}$ and a current ($i_C$) through $C_{Cell}$ by the relationship $i_P = i_C + i_{R_P} = i_N$, where both $i_P$ and $i_N$ are not equal to zero (i.e., $i_P = i_N \neq 0$). In the standby state, shown in FIG. 1B, the currents $i_N$ and $i_P$ are equal to (or approximately equal) zero (i.e., $i_P = i_N = 0$) and the $i_C$ is equal to the negative of $i_{R_P}$ (i.e., $i_C = -i_{R_P}$). From this relationship, it is appreciated by those of ordinary skill in the art that the charge of the battery cell 100 is lost via a self-discharge through the closed $C_{cell}$-$R_p$ circuit loop. Moreover, the self-discharge also occurs during the battery cell 100 actively charging or discharging with an external circuit (not shown) in signal communication with output terminals (not shown) of the battery cell 100 that are in signal communication with the positive node P and negative node N. Unfortunately, this charge loss cannot be detected at the output terminals of the battery cell 100.

Turning to FIG. 2A, a system block diagram of an example of another implementation of a battery cell 200 is shown including a plurality of battery sub-cells in accordance with the present disclosure. In this example, the typical construction of a battery cell, such as battery cell 200, is to stack up layers of cathode, separator, anode and current collector sheets following a procedure that includes wrapping up these sheets into either a cylindrical or a prismatic format. In this example, the battery cell 200 includes a plurality of battery sub-cells, which may for example, include m battery sub-cells. For purposes of illustration, only three battery sub-cells are shown but there is a total of m battery sub-cells. In this example, the first battery sub-cell includes a first capacity of the first cell ($C_{Cell,1}$), a first internal series resistance ($R_{S,1}$) of the first battery sub-cell, and a first self-discharge resistance ($R_{P,1}$) of the first battery sub-cell. The second battery sub-cell includes a second capacity of the second cell ($C_{Cell,2}$), a second internal series resistance ($R_{S,2}$) of the second battery sub-cell, and a second self-discharge resistance ($R_{P,2}$) of the second battery sub-cell. Moreover, the $m^{th}$ battery sub-cell includes a $m^{th}$ capacity of the $m^{th}$ cell ($C_{Cell,m}$), a $m^{th}$ internal series resistance ($R_{S,m}$) of the $m^{th}$ battery sub-cell, and a $m^{th}$ self-discharge resistance ($R_{P,m}$) of the $m^{th}$ battery sub-cell.

In this example, the $I_N$ at the negative node N is equal to the input current $i_P$ injected into the positive node P. The currents $i_N$ and $i_P$ are also related to the $i_{R_{P,1}}$ to $i_{R_{P,m}}$ and the $i_{C1}$ to $i_{C,m}$ through $C_{Cell,1}$ to $C_{Cell,m}$ by the relationship $i_P = i_{C,1} \ldots i_{C,m} + i_{R_{P,1}} \ldots i_{R_{P,m}} = i_N$, where both $i_P$ and $i_N$ are not equal to zero (i.e., $i_P = i_N \neq 0$). Expressed in a different way, $$i_P = \sum_{k=1}^{m} i_k = \sum_{k=1}^{m}(i_{c,k} + i_{Rp,k}) = i_N, k = 1, 2, \ldots m.$$

Similarly, the standby state, the currents $i_N$ and $i_P$ are equal to (or approximately equal) zero (i.e., $i_P = i_N = 0$) and the ic,k is equal to the negative of $i_{R_{p,k}}$ (i.e., $i_{C,k} = -i_{R_{p,k}}$).

Figure 2B:
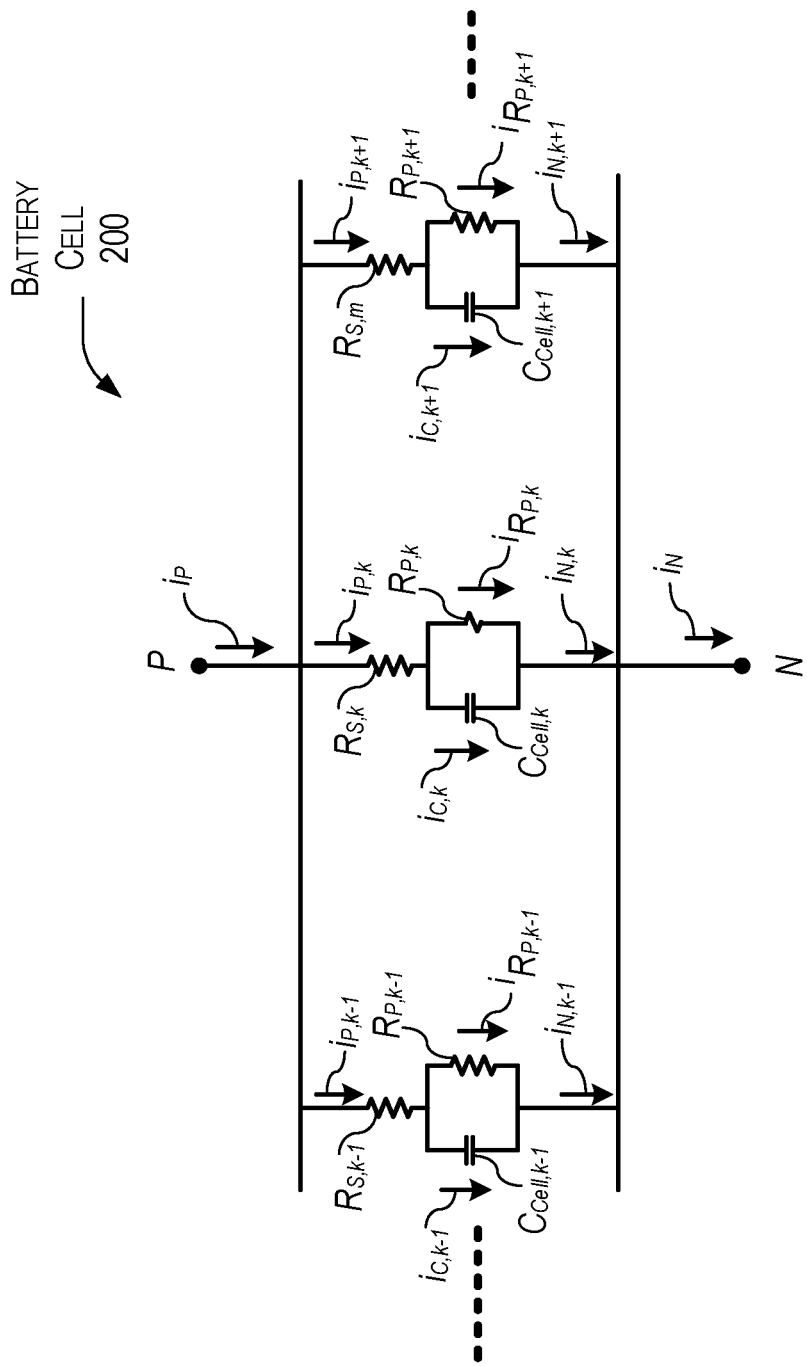
FIG. 2B is a system block diagram of an example of the implementation of a battery cell shown in FIG. 2A where a battery sub-cell of the plurality of battery sub-cells is short-circuited in accordance with the present disclosure.

In FIG. 2B, the battery cell 200 is shown with a battery sub-cell short-circuited in accordance with the present disclosure. In this example, the battery cell 200 includes the plurality of battery sub-cells, which may for example, include k battery sub-cells, where k is a subset of m. Again, for purposes of illustration, only three battery sub-cells are shown but there is a total of m battery sub-cells and the $k^{th}$ battery sub-cell is, in this example, a short-circuited battery sub-cell, which for purposes of illustration is shown in the middle of three battery sub-cells.

In this example, the first battery sub-cell includes a $k^{th}$ capacity of the $k^{th}$ cell ($C_{Cell,k}$), a $k^{th}$ internal series resistance ($R_{S,k}$) of the short-circuited battery sub-cell, and a $k^{th}$ self-discharge resistance ($R_{P,k}$) of the $k^{th}$ battery sub-cell. The previous $k-1^{th}$ battery sub-cell includes a $k-1^{th}$ capacity of the $k-1^{th}$ cell ($C_{Cell,k-1}$), a $k-1^{th}$ internal series resistance ($R_{S,k-1}$) of the $k-1^{th}$ battery sub-cell, and a $k-1^{th}$ self-discharge resistance ($R_{P,k-1}$) of the $k-1^{th}$ battery sub-cell. Moreover, the next $k+1^{th}$ battery sub-cell includes a $k+1^{th}$ capacity of the $k+1^{th}$ cell ($C_{Cell,k+1}$), a $k+1^{th}$ internal series resistance ($R_{S,k+1}$) of the $k+1^{th}$ battery sub-cell, and a $k+1^{th}$ self-discharge resistance ($R_{P,k+1}$) of the $k+1^{th}$ battery cell. In this example, the $k^{th}$ internal parallel resistance $R_{P,k}$ has a short-circuit caused, for example, by a dendrite channel built-up within the $k^{th}$ internal parallel resistance $R_{P,k}$. Because of the short-circuit, the resistance of the $k^{th}$ internal parallel resistance $R_{P,k}$ approaches zero.

As discussed earlier, in the active state, the current $i_N$ at the negative node N is equal to the current $i_P$ injected into the positive node P. Once the $k^{th}$ battery sub-cell experiences a short-circuit, both the current $i_N$ and current $i_P$ equal the $k^{th}$ current $i_k$ through the $k^{th}$ battery sub-cell, which is approximately equal to the current $i_{R_{P,k}}$ flowing through the $k^{th}$ internal series resistance $R_{S,k}$ (i.e., $i_P = i_N = i_k \approx i_{R_{p,k}}$) In the standby state, the current $i_{R_{p,k}}$ flowing is equal to the summation of all m currents $i_{C1}$ to $i_{C,m}$ through $C_{Cell,1}$ to $C_{Cell,m}$ by the relationship $$i_{Rp,k} \approx \sum_{i=1}^{m} i_{C,i}.$$

In general, the dendrite may be built at the $k^{th}$ battery sub-cell initially due to a defect or degradation, and once that dendritic channel is formed, a short-circuit occurs at that $k^{th}$ battery sub-cell. This causes the temperature to rise locally and then spread quickly heating up the adjacent battery sub-cells and eventually resulting a thermal runaway due to a creation of large short-circuit current.

Figure 3:
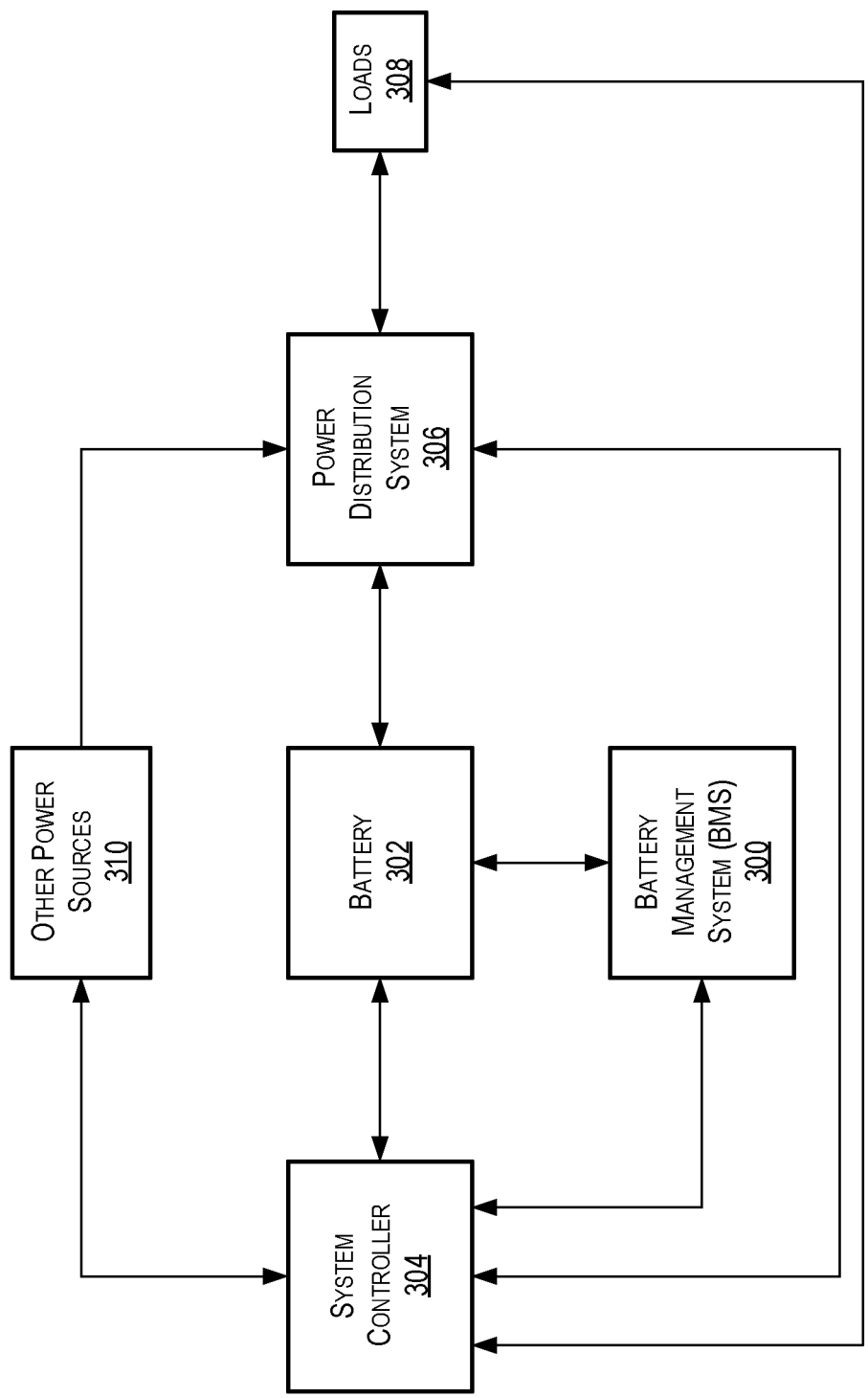
FIG. 3 is a system block diagram of an example of an implementation of a battery management system (BMS) in signal communication with a battery and system controller in accordance with the present disclosure.

Turning to FIG. 3, a system block diagram of an example of an implementation of a battery management system (BMS) 300 is shown in signal communication with a battery 302 and system controller 304 in accordance with the present disclosure. In this example, the system controller 304 may be in signal communication with a power distribution system 306, loads 308, and other power sources 310. The power distribution system 306 may also be in signal communication with the battery 302, loads 308, and the other power sources 310. In this example, the battery 302 includes one or more battery cells that may each include a plurality of battery sub-cells. The BMS 300, battery 302, system controller 304, power distribution system 306, and loads 308 may be part of, for example, an electric vehicle or portable electronic device such as, for example, a portable computer or mobile device. The power distribution system 306 may be a typical component, device, module, or circuit that is configured to control and distribute power from the battery 302 or the other power source 310 to the loads 308. The other power sources 310 may be external power source such as power chargers, generators, transformers, or other types of external power sources. The loads 308 may include motors or other devices on an electric vehicle or electronic circuitry in a portable electronic device. The system controller 304 may be a controlling device, such as, one or more processors that provide some type of control to the electric vehicle or portable electronic device. In some examples, the system controller 304 may provide processing power or control functions to the BMS 300.

In this disclosure, the BMS 300 is designed to prevent an internal short-circuit from occurring in the battery 302 by predicting a dendritic formation process as early as possible before the dendritic formation process becomes a complete short-circuit channel within the battery 302. As a result, in operation, the BMS 300 utilizes a method that use the principle of charge conservation to predict the occurrence and status of the dendrite formation or the internal short-circuit build-up process. This method is implemented by monitoring and recording the charge loss of the battery 302 during both the active and standby states of the battery 302 once the battery 302 is installed for service in the electric vehicle or portable electronic device.

Figure 4:
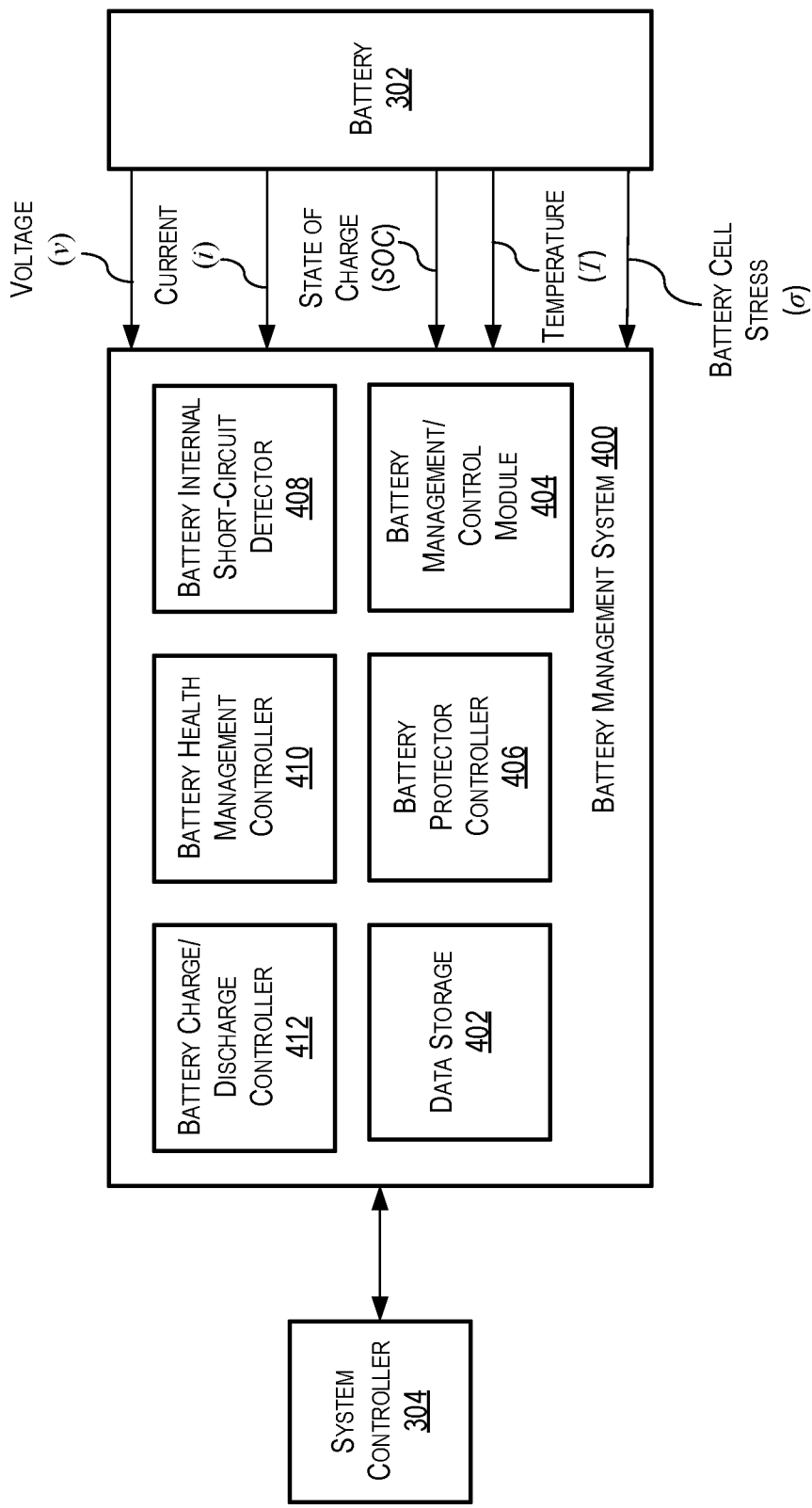
FIG. 4 is a block diagram of an example of an implementation of the BMS shown in FIG. 3 in accordance with the present disclosure.

In FIG. 4, a block diagram of an example of an implementation of the BMS 400 is shown in accordance with the present disclosure. In this example, the BMS 400 may include a data storage 402, battery management/control module 404, battery protector controller 406, battery internal short-circuit detector 408, battery health management controller 410, and battery charge/discharge controller 412. In this example, the data storage 402 is a memory device configured to store initialization information about the battery 302, updates to measured and computed data related to the battery 302, control information from the system controller 304, and software storage for instructions performed by one or more processors in the BMS 400. The battery internal short-circuit detector 408 may include one or more circuits, components, devices, or modules configured to measure data from battery 302 (such, as current and voltage produced or temperature of the battery 302) in order to detect a short-circuit within the battery 302. The battery charge/discharge controller 412 may include one or more circuits, components, devices, or modules that configure the BMS 400 or other circuitry (such as, the power distribution system 306) to either draw power from the battery 302 (i.e., discharge) or inject power into the battery 302 (i.e., charge). The battery health management controller 410 may include one or more circuits, components, devices, or modules that determine the state and health of the battery 302 from data measured from the battery 302 such as current, voltage, and temperature of the battery 302. The battery protector controller 406 may include one or more circuits, components, devices, or modules that configured to produce alarms and/or control signals to allow the BMS 400 to control the operation of the battery 302. In an example of operation, the battery 302 provides a voltage (v), current (i), SOC value, temperature (T), and battery cell stress ($\sigma$) value to the battery management system 400.

Figure 5:
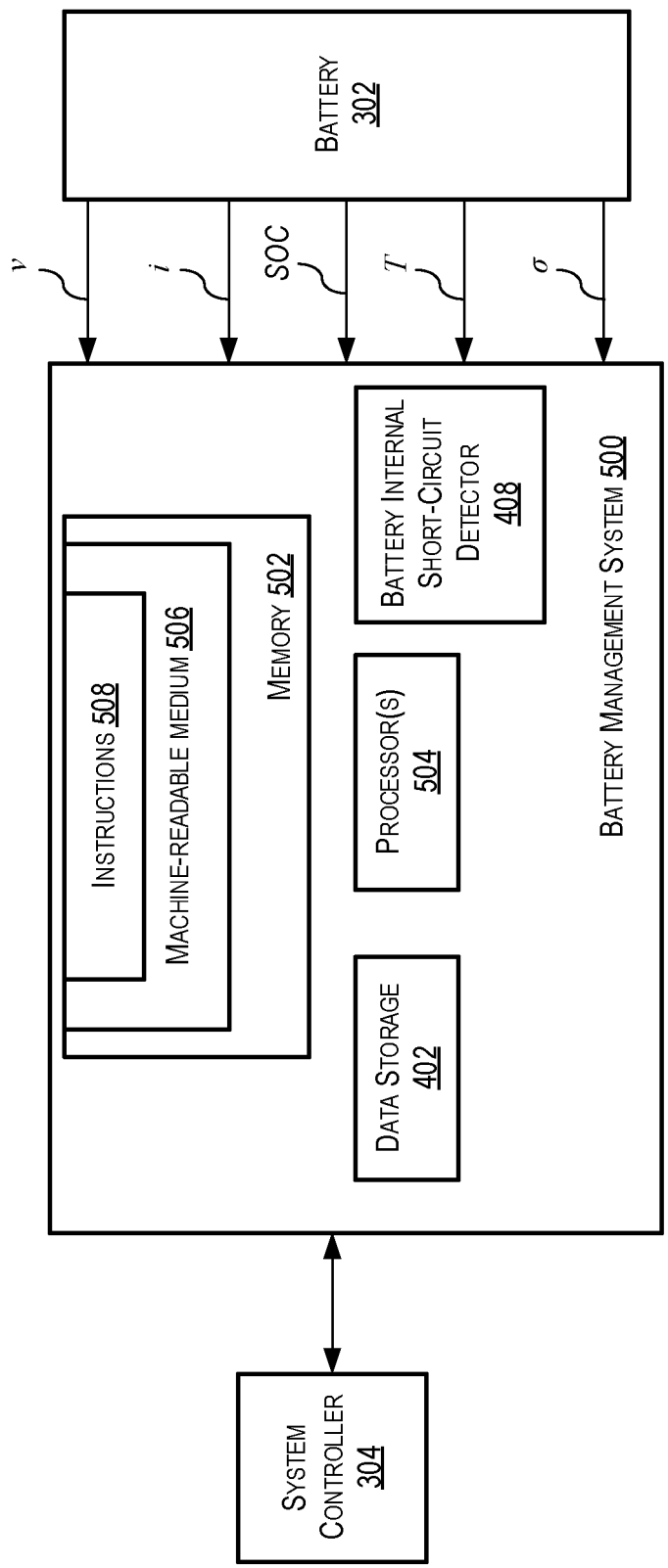
FIG. 5 is a block diagram of an example of another implementation of the BMS shown in FIG. 3 in accordance with the present disclosure.

In FIG. 5, a block diagram of an example of another implementation of the battery management system (BMS) 500 is shown in accordance with the present disclosure. In this example, the BMS 500 includes a memory 502, one or more processing units 504 (also referred to simply as "processors), and a machine-readable medium 506 on the memory 502. In this example, the machine-readable medium 506 stores instructions 508 that, when executed by the one or more processing units 504, cause the BMS 500 to perform numerous operations of a method for early detection of the battery cell internal short-circuit within the battery 302. In this example, the memory 502 may be part of the data storage 402. Additionally, the one or more processors 504 may be part of or operate in combination with processors in the system controller 304. The BMS 500 may again include the battery internal short-circuit detector 408 that is configured to measure data from battery 302 in order to detect a short-circuit within the battery 302, where the one or more processor 504 may be configured to control the one or more circuits, components, devices, or modules of the battery internal short-circuit detector 408.

It is appreciated by those of ordinary skill in the art that the circuits, circuits, components, modules, and/or devices of, or associated with, the BMS 300, 400, or 500 are described as being in signal communication with each other, where signal communication refers to any type of communication and/or connection between the circuits, components, modules, and/ or devices that allows a circuit, component, module, and/or device to pass and/or receive signals and/or information from another circuit, component, module, and/or device. The communication and/or connection may be along any signal path between the circuits, components, modules, and/or devices that allows signals and/or information to pass from one circuit, component, module, and/or device to another and includes wireless or wired signal paths. The signal paths may be physical, such as, for example, conductive wires, electromagnetic wave guides, optical fibers, cables, attached and/or electromagnetic or mechanically coupled terminals, semi-conductive or dielectric materials or devices, or other similar physical connections or couplings. Additionally, signal paths may be non-physical such as free-space (in the case of electromagnetic propagation) or information paths through digital components where communication information is passed from one circuit, component, module, and/or device to another in varying digital formats, without passing through a direct electromagnetic connection.

In an example of operation, the BMS 500 performs a method with a number of operations that include receiving initialization data for the battery cell at a service start time. The battery 302 again provides v, i, SOC value, T, and battery cell stress a value to the BMS 500. The initialization data includes a predetermined state of charge SOC as a function of time, a predetermined input criteria parameter $\delta$, a predetermined active state charge loss criteria $Q_{cri}^{act}$, a predetermined standby state charge loss criteria $Q_{cri}^{sb}$, and a predetermined battery effective capacity C as a function of time. The operations also comprise measuring a terminal current i of the battery 302 at the service start time and determining if the battery 302 is in the active state or the standby state. Moreover, the operations comprise determining a charge flow into the battery 302 $Q_{chr}$ and a charge flow out of the battery 302 $Q_{dis}$ utilizing i if the battery 302 is in the active state, determining an active state charge loss $Q_{loss}^{act}$ at an end of one effective charge-discharge cycle utilizing $Q_{chr}$ and $Q_{dis}$, and producing an alarm signal if $Q_{loss}^{act}$ is equal to or greater than $Q_{cri}^{act}$ or, otherwise, advancing a time step, measuring i, and repeating the operation of determining if the battery 302 is in the active state or the standby state. Furthermore, the operations comprise periodically monitoring a SOC value of the SOC if the battery cell is in the standby state, determining a standby state charge loss $Q_{loss}^{sb}$ at the end of each period defined by $\tau_2$ utilizing the SOC value, an initial SOC value at a beginning of each period, and C value at the beginning of each period, and producing an alarm signal if $Q_{loss}^{sb}$ is equal to or greater than $Q_{cri}^{sb}$ or, otherwise, advancing the time step, measuring i, and repeating the operation of determining if the battery 302 is in the active state or the standby state. In this example, the alarm signal maybe be passed to the system controller 304 to inform user of the electric vehicle or portable electronic device about the existence of a short-circuit within the battery 302. Moreover, in this example, the battery 302 may include one or more battery cells.

Also, in this example, the predetermined SOC may be a first data set as a function of multiple variables and C is a second data set as a function of multiple variable. The first data set for the predetermined SOC, and second data set for C are obtained by characterization testing of a plurality of samples of the battery 302 prior to the service start time. Furthermore, the battery internal short-circuit detector 408 may be configured to measure i, where the BMS 500 is configured to perform further operations. These further operations may include measuring a terminal voltage v and temperature T of the battery 302 along with measuring i. The battery capacity C is a function of the degradation factor d which is a function of time, current i, voltage v, and temperature T The operations may also include updating d utilizing v, T, and i, and updating SOC, C, and a charge accumulation ($Q_{cyc}$) during one equivalent charge-discharge cycle. In this example, the battery internal short-circuit detector 408 is configured to measure v, T, and i, and the initialization data for the battery 302 and the measured v, T, and i are stored in a data storage device (i.e., data storage 402). Other examples of the BMS 500 may also utilize the data on battery cell stress (σ) and pressure (p) in addition to i, T and v for various health management purposes.

In this example, updating SOC may include setting SOC value at a time (τ) at the end of one equivalent charge-discharge cycle to equal the initial SOC value, and the BMS 500 may be configured to perform operations further including: determining that the battery cell is in the standby state includes determining that i is approximately zero; determining that the battery cell is in the active state includes determining that i is either less then or greater than zero, wherein the battery cell is in a discharge state if i is greater than zero and in a charging state if i is less than zero; setting a standby time ($\tau_{sb}$) that is incremented by τ, determining if $\tau_{sb}$ is equal to or greater than a periodic check time ($\tau_2$) for a periodic check of $Q_{loss}^{sb}$; advancing the time step, measuring i, and repeating the operation of determining if the battery cell is in the active state or the standby state if $\tau_{sb}$ is less than $\tau_2$, or, otherwise, setting equal to C multiplied by a quantity of the initial SOC value subtracted by the SOC value at $\tau_{sb}$; determining if $Q_{loss}^{sb}$ is equal to or greater than $Q_{cri}^{sb}$; and producing the alarm signal if $Q_{loss}^{sb}$ is equal to or greater than $Q_{cri}^{sb}$ or, otherwise, advancing the time step, measuring i, and repeating the operation of determining if the battery cell is in the active state or the standby state.

Moreover, updating SOC may include setting SOC value at a time (τ) at the end of one pre-determined period of time to equal the initial SOC value, and the BMS is configured to perform operations further comprising determining $Q_{chr}$ includes integrating i from an initial time to τ when i is greater than zero and determining $Q_{dis}$ includes integrating i from the initial time to τ when i is less than zero. In this example, $Q_{loss}^{act}$ is equal to $Q_{chr}$ subtracted by $Q_{dis}$ at τ and determining the $Q_{loss}^{act}$ includes determining a difference in charge flow into the battery ($\Delta Q_{chr}$) and a difference in charge flow out of the battery ($\Delta Q_{dis}$) for each time step $\tau_1$. The operations may also include: determining if $\Delta Q_{chr}$ is less than $Q_{cyc}$; advancing the time step, measuring i, and repeating the operation of determining if the battery cell is in the active state or the standby state if $\Delta Q_{chr}$ is less than $Q_{cyc}$, or, otherwise, determining if a magnitude of a quantity of the SOC value subtracted by the initial SOC value is less than δ; and advancing the time step, measuring i, and repeating the operation of determining if the battery cell is in the active state or the standby state if the magnitude is equal to or greater than δ, or, otherwise, setting $Q_{loss}^{act}$ to equal $\Delta Q_{chr}$ subtracted by $\Delta Q_{dis}$.

In this example, determining $\Delta Q_{chr}$ may include setting $\Delta Q_{chr}$ equal to a combination of a previous value of $\Delta Q_{chr}$ and the integration of i from the previous time step to τ, if i is greater than zero or, otherwise, setting $\Delta Q_{chr}$ equal to a previous value of $\Delta Q_{chr}$ if i is less than zero.

Moreover, determining $\Delta Q_{dis}$ may include setting $\Delta Q_{dis}$ equal to a combination of a previous value of $\Delta Q_{dis}$ and the integration of i from the previous time step to τ, if i is less than zero or, otherwise, setting $\Delta Q_{dis}$ equal to a previous value of $\Delta Q_{dis}$ if i is greater than zero.

In this example of operation, the δ is an input criteria parameter, usually very small, to measure the difference between $SOC_k$ and $SOC_0$. In this example, the magnitude difference (i.e, $|SOC_k - SOC_0| < \delta$) is used to detect if one equivalent charge-discharge cycle is achieved. The τ is an input time step size, where each time that the clock advances by τ, the number of step progresses from k to k+1, and the BMS 500 executes the program by reading $SOC_k$ and $Q_{cyc,k}$, calculating the charge loss, and determining if the charge loss exceeds the criteria. The $\tau_{sb}$ is an input time for a periodic check charge loss in the case that the battery 302 is in a standby mode. The d(t) is the degradation factor of the battery 302 capacity. The battery 302 capacity (in ampere hours "Ah") fades as the time passes. In general, the mechanism causing a capacity fade may be due to active material degradation or loss within the battery 302. The capacity fade or capacity degradation factor is strongly dependent on the number of cycles and other operation conditions such as temperatures and levels of discharge currents, etc. In the standby state (or before installation with a shelf life), the battery 302 capacity also fades. Therefore, it is appropriate to characterize the degradation factor as a function of the time. At the beginning of a battery 302 life, d(0)=1.0. When t>0, d(t)<1.0 (i.e., decreases). The battery 302 capacity C(t) may be expressed, using the degradation factor, as C(t)=d(t)C(0). In general, in these example, Q is defined as the electronic charge and $Q_{cyc,k}$ is defined as a charge accumulation during one effective full charge cycle or a discharge cycle. The role of the step is to check if $\Delta Q_{chr,k} < Q_{cyc,k}$ in the BMS 500 is to exclude the minor charging/discharging loops.

In other words, in active state, the process starts by recording and integrating the terminal current of the battery 302 at the time of service start (i.e., t=0). During period of time from t=0 to τ, the BMS 500 determines the charge flow into $Q_{chr}$ and out $Q_{dis}$ the battery 302 separately by utilizing the following relationships:

$$\begin{cases} Q_{chr}(\tau) = \int_0^\tau |i| dt \text{ for } i < 0, \\ \quad \text{and} \\ Q_{dis}(\tau) = \int_0^\tau i\, dt \text{ for } i > 0. \end{cases}$$

The BMS 500 then determines the charge loss at the end of one equivalent charge-discharge cycle that is defined as the state of charge SOC that returns to the original state of charge—i.e., SOC(τ)=SOC(0). In general, the SOC is a function of voltage, current, temperature, and the degradation factor such that SOC(t)=$f_1$(v, i, T, d). In this example, the data set for the SOC as a function of multiple variables may be obtained via characterization testing on the appropriate number of samples of a particular battery cells (such as battery 302) before installed for service in the electric vehicle or portable electronic device.

Although one equivalent charge-discharge cycle is calculated by the BMS 500 according to SOC(τ)=SOC(0), many minor charge cycles may occur during this time. As such, the charge loss after one equivalent charge-discharge cycle is then described by the relationship $$Q_{loss}^{act}(\tau) = Q_{chr}(\tau) - Q_{dis}(\tau).$$

The BMS 500 then determines if the charge loss exceeds the criteria and accordingly sets an action (i.e., send an alarm signal) depending on the whether $$\begin{cases} Q_{loss}^{act}(\tau) \geq Q_{cri}^{act}, \text{ send an } alam \text{ signal,} \\ \text{Otherwise, reset the clock and begin the next calculation cycle.} \end{cases}$$

In the standby state (i.e., the battery is losing charge but not actively in charging or discharging), the BMS 500 performs a periodic check on the state of charge and calculate the charge loss according to $$Q_{loss}^{sb}=(SOC(0)-SOC(\tau))\cdot C(\ ),$$

where C is the battery 302 effective capacity and the battery 302 effective capacity is a function of voltage, current, temperature and degradation factor such that $C(t)=f_2(v, i, T, d)$. Similarly, the data set for a C may be obtained via characterization testing on an appropriate number of battery cell (i.e., battery 302) samples prior to a service installation in the electric vehicle or portable electronic device.

The BMS 500 then determines if the charge loss exceeds the criteria and accordingly sets an action (i.e., send an alarm signal) depending on the whether $$\begin{cases} Q_{loss}^{sb}(\tau) \geq Q_{cri}^{sb}, \text{ send an } alam \text{ signal,} \\ \text{Otherwise, reset the clock and begin the next calculation cycle.} \end{cases}$$

As discussed previously, the charge loss criteria for the active state $Q_{cri}^{act}$ and the standby state $Q_{cri}^{sb}$ can be determined through battery cell characterization testing prior to installing the battery 302 for service in the electric vehicle or portable electronic device. In addition, a safety factor may also be pre-determined for early internal short-circuit prevention.

Figure 6A:
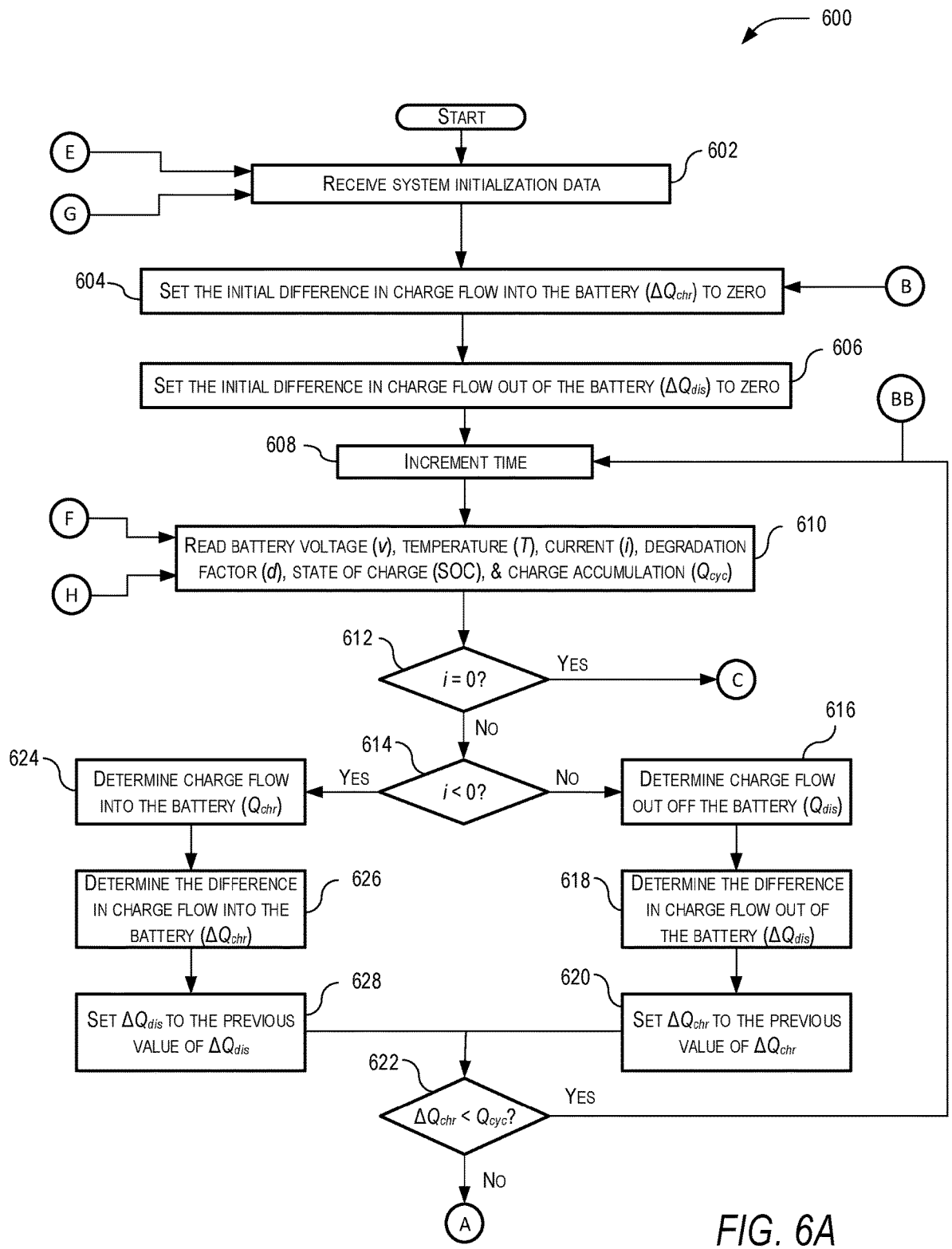
FIG. 6A is a flowchart of an example of an implementation of a first of three parts of a method of operation of the BMS in accordance with the present disclosure.
Figure 6B:
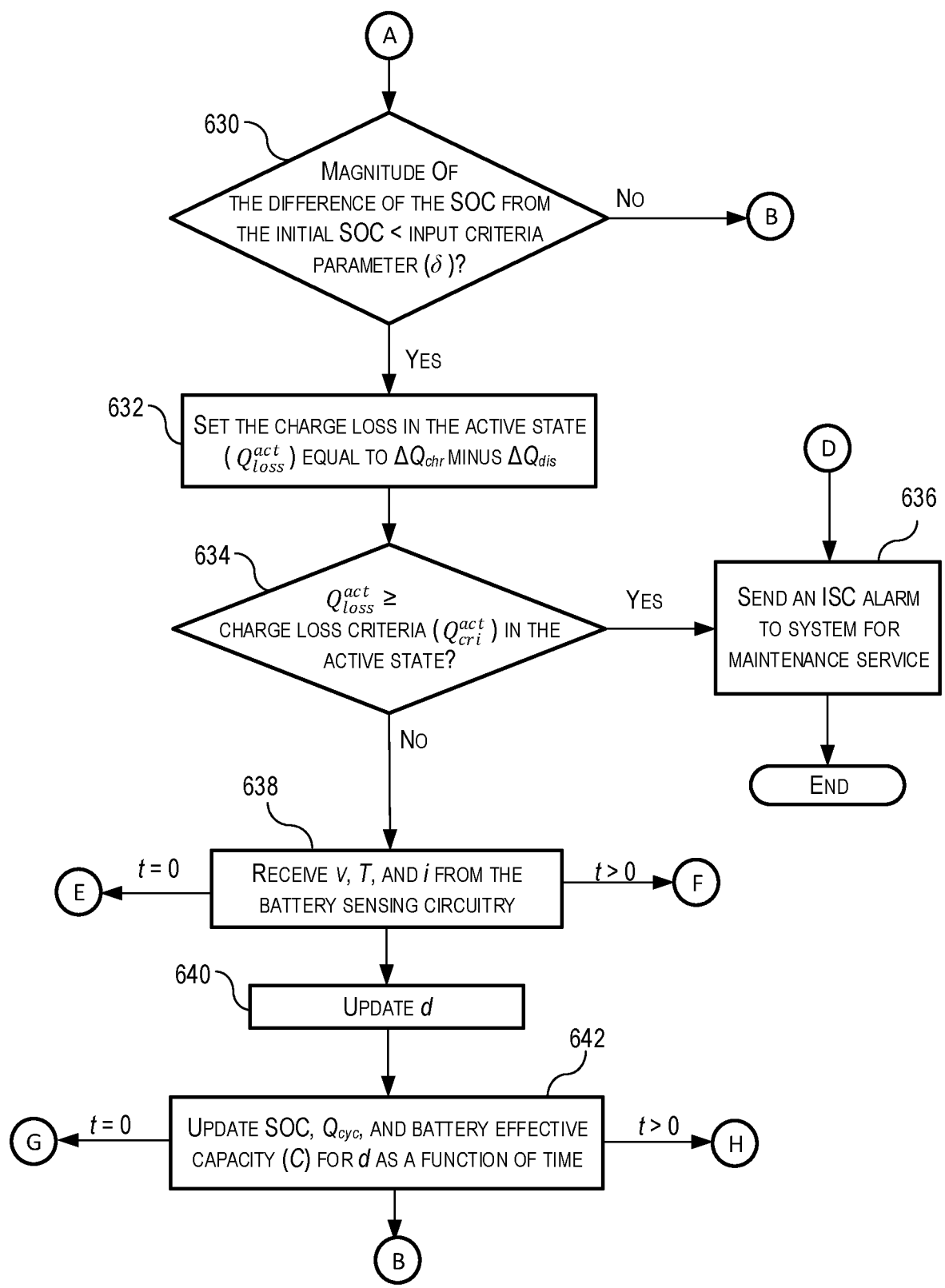
FIG. 6B is a flowchart of the second part of the method of operation of the BMS shown in FIG. 6A in accordance with the present disclosure.
Figure 6C:
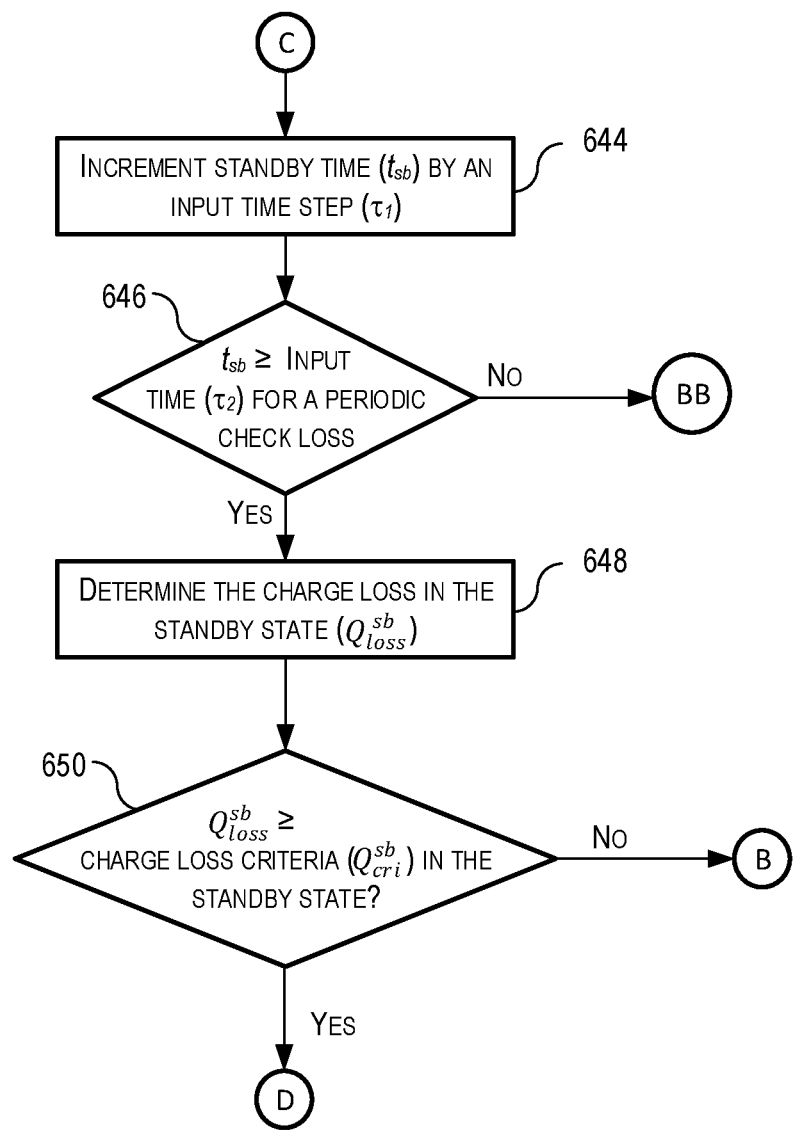
FIG. 6C is a flowchart of the third part of the method of operation of the BMS shown in FIG. 6A in accordance with the present disclosure.

FIG. 6A is a flowchart of an example of an implementation of a first of three parts of a method 600 of operation of the BMS 300, 400, or 500 in accordance with the present disclosure. In FIG. 6B, a flowchart of the second part of the method 600 is shown in accordance with the present disclosure. In FIG. 6C, a flowchart of the third part of the method 600 is shown in accordance with the present disclosure. The method 600 starts by receiving 602 the system initialization data for the battery 302 at a service start time at t=0. As discussed earlier, the initialization data includes a predetermined SOC as a function of time, a predetermined input criteria parameter δ, a predetermined active state charge loss criteria $Q_{cri}^{act}$, a predetermined standby state charge loss criteria $Q_{cri}^{sb}$, and a predetermined battery effective capacity C as a function of time. The method 600 sets 604 $\Delta Q_{chr}$ equal to zero, sets 606 $\Delta Q_{dis}$ equal to zero, and then increments the time 608 and continue for k as discussed earlier. The method 600 then measures (i.e., reads) 610 current i, temperature T, voltage v, degradation factor d, state of charge SOC, and charge accumulation $Q_{cyc}$ of the battery 302 at the service start time or at a new cycle time and then determines if the battery 302 is in the active state or the standby state by determining 612 if i is equal to zero. If i is not equal to zero, the battery 302 is in the active state and the method 600 determines 614 if battery 302 is charging or discharging. In 614, if i is greater than or equal to zero, the battery 302 is discharging and the method 600 determines 616 the charge flow $Q_{dis}$ out of the battery 302, determines 618 the difference in charge flow $\Delta Q_{dis}$ out of the battery, and sets 620 the $\Delta Q_{chr}$ to the previous value of $\Delta Q_{chr}$. The method 600 then determines 622 if $\Delta Q_{chr}$ is less than $Q_{cyc}$, and if true, the method returns to step 608 where the time is incremented by a time step and process repeats. In these steps, the $\Delta Q_{dis,k}$ and $\Delta Q_{chr}$ are determined by the relationships $$\Delta Q_{dis,k}=\Delta Q_{dis,k-1}+\int_{\tau_{k-1}}^{\tau_{k-1}+\tau_1} i dt$$

and $$\Delta Q_{chr,k}=\Delta Q_{chr,k-1}.$$

Instead, if in 614 the i is less than zero, the battery 302 is charging and the method 600 determines 624 the charge flow $Q_{chr}$ into the battery 302, determines 626 the difference in charge flow $\Delta Q_{chr}$ into the battery, and sets 628 the $\Delta Q_{dis}$ to the previous value of $\Delta Q_{dis}$. The method 600 then again determines 622 if $\Delta Q_{chr}$ less than $Q_{cyc}$, and if true, the method returns to step 608 where the time is incremented by a time step and process repeats. In these steps, the $\Delta Q_{dis,k}$ and $\Delta Q_{dis,k}$ are determined by the relationships $$\Delta Q_{chr,k}=\Delta Q_{chr,k-1}+\int_{\tau_{k-1}}^{\tau_{k-1}+\tau_1} i dt$$

and $$\Delta Q_{dis,k}=\Delta Q_{dis,k-1}.$$

Instead, if in 622 the $\Delta Q_{chr}$ is equal to or greater than $Q_{cyc}$, the method 600 determines 630 if $|SOC_k-SOC_0|<\delta$. If not, the method 600 returns to step 604. The method 600 again sets 604 $\Delta Q_{chr}$ equal to zero, sets 606 $\Delta Q_{dis}$ equal to zero, increments the time 608 and continue for k as discussed earlier, and process repeats. In 630, if true, the method 600 sets 632 $Q_{loss}^{act}=\Delta Q_{chr}-\Delta Q_{dis}$ and determines 634 if $Q_{loss}^{act}(\tau) \geq Q_{cri}^{act}$. If true, the method 600 sends 636 an internal short-circuit (ISC) alarm signal to the system controller 304 for maintenance service and the process ends.

If not true, the method 600 returns to step 604. The method 600 again sets 604 $\Delta Q_{chr}$ equal to zero, sets 606 $\Delta Q_{dis}$ equal to zero, increments the time 608 and continue for k as discussed earlier, and process repeats. However, prior to returning to step 604, the method 600 also receives 638 new measured values for v, T, i from the battery sensing circuitry that may be part of the battery internal short-circuit detector 408. In this example, if t=0, these measured values are sent to the initialization step 602 or if t>0, these measured values are sent to measurement step 610. Irrespective of whether t=0 or t>0, the method 600 then updates 640d and updates 642 the values for SOC, $Q_{cyc}$, and C and passes those updated values to the initialization step 602 or if t>0, these measured values are sent to measurement step 610.

Returning to decision step 612, if, instead, the i is equal to zero, the battery 302 is in the standby state and the method 600 increments 644 the standby time $\tau_{sb}$ by an input step $\tau_1$ and determines 646 if $\tau_{sb} \geq \tau_2$ for a periodic check loss. If no, the method returns to step 608 where the time is incremented by a time step and process repeats. If yes, the method 600 determines 648 the charge loss $Q_{loss}^{sb}$ in the standby state, where $Q_{loss}^{sb}=(SOC_0-SOC_k)\cdot C(d_k)$.

The method 600 then determines 650 if $Q_{loss}^{sb}(\tau) \geq Q_{cri}^{sb}$. If true, the method 600 sends 636 an ISC alarm signal to the system controller 304 for maintenance service and ends. If false, the method 600 returns to step 604. The method 600 then again sets 604 $\Delta Q_{chr}$ equal to zero, sets 606 $\Delta Q_{dis}$ equal to zero, increments the time 608 and continue for k as discussed earlier, and process repeats.

It will be understood that various aspects or details of the disclosure may be changed without departing from the scope of the disclosure. It is not exhaustive and does not limit the claimed disclosures to the precise form disclosed. Furthermore, the foregoing description is for the purpose of illustration only, and not for the purpose of limitation. Modifications and variations are possible in light of the above description or may be acquired from practicing the disclosure. The claims and their equivalents define the scope of the disclosure. Moreover, although the techniques have been described in language specific to structural features and/or methodological acts, it is to be understood that the appended claims are not necessarily limited to the features or acts described. Rather, the features and acts are described as example implementations of such techniques.

To the extent that terms "includes," "including," "has," "contains," and variants thereof are used herein, such terms are intended to be inclusive in a manner similar to the term "comprises" as an open transition word without precluding any additional or other elements. Moreover, conditional language such as, among others, "can," "could," "might" or "may," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example. Conjunctive language such as the phrase "at least one of X, Y or Z," unless specifically stated otherwise, is to be understood to present that an item, term, etc. may be either X, Y, or Z, or a combination thereof.

What is claimed:

1. A method for early detection of a battery cell internal short-circuit with a battery management system, the method comprising:
   receiving initialization data for the battery cell at a service start time, wherein the initialization data includes a predetermined state of charge (SOC) as a function of time, current, voltage, and temperature, a predetermined input criteria parameter ($\delta$), a predetermined active state charge loss criteria ($Q_{cri}^{act}$), a predetermined standby state charge loss criteria ($Q_{cri}^{sb}$), and a predetermined battery effective capacity (C) as a function of time, current, voltage, and temperature;
   measuring a terminal current (i) of the battery cell at the service start time;
   determining if the battery cell is in the active state or the standby state;
   determining a charge flow into the battery cell ($Q_{chr}$) and a charge flow out of the battery cell ($Q_{dis}$) utilizing i if the battery cell is in the active state;
   determining an active state charge loss ($Q_{loss}^{act}$) at an end of one equivalent charge-discharge cycle utilizing $Q_{chr}$ and $Q_{dis}$;
   producing an alarm signal if $Q_{loss}^{act}$ is equal to or greater than $Q_{cri}^{act}$ or, otherwise, advancing a time step, measuring i, and repeating the step of determining if the battery cell is in the active state or the standby state;
   periodically monitoring a SOC value of the SOC if the battery cell is in the standby state;
   determining a standby state charge loss ($Q_{loss}^{sb}$) at an end of one period of time utilizing the SOC value, an initial SOC value at a beginning of the one period, and C; and
   producing an alarm signal if $Q_{loss}^{sb}$ is equal to or greater than $Q_{cri}^{sb}$ or, otherwise, advancing the time step, measuring i, and repeating the step of determining if the battery cell is in the active state or the standby state.

2. The method of claim 1, wherein
   the predetermined SOC is a first data set as a function of multiple variables,
   C is a second data set as a function of multiple variables, and
   $Q_{cri}^{act}$, $Q_{cri}^{sb}$, the first data set for the predetermined SOC, and second data set for C are obtained by characterization testing of a plurality of samples of the battery cell prior to the service start time.

3. The method of claim 1, further including
   measuring a terminal voltage (v) and temperature (T) of the battery cell along with measuring i, wherein C is equal to a degradation factor (d) of a capacity of the battery cell as a function of time, and
   updating d utilizing v, T, and i, and
   updating SOC, C, and a charge accumulation ($Q_{cyc}$) during one equivalent charge-discharge cycle.

4. The method of claim 3, wherein v, T, and i are measured with one or more battery sensing circuits in signal communication with the battery cell.

5. The method of claim 4, wherein the initialization data for the battery cell and the measured v, T, and i are stored in data storage device.

6. The method of claim 3, wherein
   determining that the battery cell is in the standby state includes determining that i is approximately zero,
   determining that the battery cell is in the active state includes determining that i is either less then or greater than zero, wherein the battery cell is in a discharge state if i is greater than zero and in a charging state if i is less than zero.

7. The method of claim 6, wherein updating SOC includes setting SOC value at a time ($\tau$) at an end of one predetermined period of time to equal the initial SOC value.

8. The method of claim 7, further comprising
   setting a standby time ($\tau_{sb}$) that is incremented by $\tau$,
   determining if $\tau_{sb}$ is equal to or greater than a periodic check time ($\tau_2$) for a periodic check of $Q_{loss}^{sb}$,
   advancing the time step, measuring i, and repeating the step of determining if the battery cell is in the active state or the standby state if $\tau_{sb}$ is less than $\tau_2$ or, otherwise,
   setting $Q_{loss}^{sb}$ equal to C multiplied by a quantity of the initial SOC value subtracted by the SOC value at $\tau_{sb}$,
   determining if $Q_{loss}^{sb}$ is equal to or greater than $Q_{cri}^{sb}$,
   producing the alarm signal if $Q_{loss}^{sb}$ is equal to or greater than $Q_{cri}^{sb}$ or, otherwise, advancing the time step, measuring i, and repeating the step of determining if the battery cell is in the active state or the standby state.

9. The method of claim 7, wherein
   determining (624) $Q_{chr}$ includes integrating a magnitude of i from an initial time to $\tau$ when i is less than zero and
   determining (616) $Q_{dis}$ includes integrating i from the initial time to $\tau$ when i is greater than zero.

10. The method of claim 9, wherein $Q_{loss}^{act}$ is equal to $Q_{chr}$ subtracted by $Q_{dis}$ at $\tau$.

11. The method of claim 9, wherein
   determining the $Q_{loss}^{act}$ includes determining a difference in charge flow into the battery ($\Delta Q_{chr}$) and a difference in charge flow out of the battery ($\Delta Q_{dis}$),
   determining (622) if $\Delta Q_{chr}$ is less than $Q_{cyc}$,
   advancing the time step, measuring i, and repeating the step of determining if the battery cell is in the active state or the standby state if $\Delta Q_{chr}$ is less than $Q_{cyc}$ or, otherwise,
   determining (630) if a magnitude of a quantity of the SOC value subtracted by the initial SOC value is less than $\delta$,
   advancing the time step, measuring i, and repeating the step of determining if the battery cell is in the active state or the standby state if the magnitude is equal to or greater than $\delta$ or, otherwise,
   setting $C_{loss}^{act}$ to equal $\Delta Q_{chr}$ subtracted by $\Delta Q_{dis}$.

12. The method of claim 11, wherein determining $\Delta Q_{chr}$ includes
   setting $\Delta Q_{chr}$ equal to a combination of a previous value of $\Delta Q_{chr}$ and the integration of i from the initial time to $\tau$, if i is greater than zero or, otherwise,
   setting $\Delta Q_{chr}$ equal to a previous value of $\Delta Q_{chr}$ if i is less than zero.

13. The method of claim 11, wherein determining $\Delta Q_{dis}$ includes
   setting $\Delta Q_{dis}$ equal to a combination of a previous value of $\Delta Q_{dis}$ and the integration of i from the initial time to $\tau$, if i is less than zero or, otherwise,
   setting $\Delta Q_{dis}$ equal to a previous value of $\Delta Q_{dis}$ if i is greater than zero.

14. The method of claim 1, further comprising transmitting the alarm signal to a system controller external from the battery cell and battery management system.

15. A battery management system (BMS) for early detection of a battery cell internal short-circuit, the BMS comprising:
   a memory;
   one or more processing units;
   a machine-readable medium on the memory, the machine-readable medium storing instructions that, when executed by the one or more processing units, cause the BMS to perform operations comprising:
   receiving initialization data for the battery cell at a service start time, wherein the initialization data includes a predetermined state of charge (SOC) as a function of time, a predetermined input criteria parameter ($\delta$), a predetermined active state charge loss criteria ($Q_{cri}^{act}$), a predetermined standby state charge loss criteria ($Q_{cri}^{sb}$), and a predetermined battery effective capacity (C) as a function of time;
   measuring a terminal current (i) of the battery cell at the service start time;
   determining if the battery cell is in the active state or the standby state;
   determining a charge flow into the battery cell ($Q_{chr}$) and a charge flow out of the battery cell ($Q_{dis}$) utilizing i if the battery cell is in the active state;
   determining an active state charge loss ($Q_{loss}^{act}$) at an end of one equivalent charge-discharge cycle utilizing $Q_{chr}$ and $Q_{dis}$;
   producing an alarm signal if $Q_{loss}^{act}$ is equal to or greater than $Q_{cri}^{act}$ or, otherwise, advancing a time step, measuring i, and repeating the operation of determining if the battery cell is in the active state or the standby state;
   periodically monitoring a SOC value of the SOC if the battery cell is in the standby state;
   determining a standby state charge loss ($Q_{loss}^{sb}$) at an end of one pre-determine period of time utilizing the SOC value, an initial SOC value at a beginning of the period, and C; and
   producing an alarm signal if $Q_{loss}^{sb}$ is equal to or greater than $Q_{cri}^{sb}$ or, otherwise, advancing the time step, measuring the terminal current i, and repeating the operation of determining if the battery cell is in the active state or the standby state.

16. The BMS of claim 15, wherein
   the predetermined SOC is a first data set as a function of multiple variables,
   C is a second data set as a function of multiple variable, and
   $Q_{cri}^{act}, Q_{cri}^{sb}$, the first data set for the predetermined SOC, and second data set for C are obtained by characterization testing of a plurality of samples of the battery cell prior to the service start time.

17. The BMS of claim 15, further including
   a battery internal short-circuit detector that is configured to measure i,
   wherein the BMS is configured to perform operations further comprising
   measuring a terminal voltage (v) and temperature (T) of the battery cell along with measuring i, wherein C is equal to a degradation factor (d) of a capacity of the battery cell as a function of time, and
   updating d utilizing v, T, and i, and
   updating SOC, C, and a charge accumulation ($Q_{cyc}$) during one equivalent charge-discharge cycle and
   wherein the battery internal short-circuit detector is configured to measure v, T, and i, and
   wherein the initialization data for the battery cell and the measured v, T, and i are stored in a data storage device.

18. The BMS of claim 17, wherein
   mupdating SOC includes setting SOC value at a time ($\tau$) at the end of one equivalent charge-discharge cycle if an active state or at the end of one pre-determined period of time if a standby state to equal the initial SOC value, and
   the BMS is configured to perform operations further comprising
   determining that the battery cell is in the standby state includes determining that i is approximately zero,
   determining that the battery cell is in the active state includes determining that i is either less then or greater than zero, wherein the battery cell is in a discharge state if i is greater than zero and in a charging state if i is less than zero,
   setting a standby time ($\tau_{sb}$) that is incremented by $\tau$,
   determining if $\tau_{sb}$ is equal to or greater than a periodic check time ($\tau_2$) for a periodic check of $Q_{loss}^{sb}$,
   advancing the time step, measuring i, and repeating the operation of determining if the battery cell is in the active state or the standby state if $\tau_{sb}$ is less than $\tau_2$, or, otherwise,
   setting $Q_{loss}^{sb}$ equal to C multiplied by a quantity of the initial SOC value subtracted by the SOC value at $\tau_{sb}$,
   determining if $Q_{loss}^{sb}$ is equal to or greater than $Q_{cri}^{sb}$,
   producing the alarm signal if $Q_{loss}^{sb}$ is equal to or greater than $Q_{cri}^{sb}$ or, otherwise, advancing the time step, measuring i, and repeating the operation of determining if the battery cell is in the active state or the standby state.

19. The BMS of claim 17, wherein
   updating SOC includes setting SOC value at a time ($\tau$) at the end of one period of pre-determined periodic time to equal the initial SOC value, and
   the BMS is configured to perform operations further comprising
   determining $Q_{chr}$ includes integrating a magnitude of i from an initial time to $\tau$ when i is less than zero,
   determining $Q_{dis}$ includes integrating i from the initial time to $\tau$ when i is greater than zero, wherein $Q_{loss}^{act}$ is equal to $Q_{chr}$ subtracted by $Q_{dis}$ at $\tau$,
   determining the $Q_{loss}^{act}$ includes determining a difference in charge flow into the battery ($\Delta Q_{chr}$) and a difference in charge flow out of the battery ($\Delta Q_{dis}$),
   determining if $\Delta Q_{chr}$ is less than $Q_{cyc}$,
   advancing the time step, measuring i, and repeating the operation of determining if the battery cell is in the active state or the standby state if $\Delta Q_{chr}$ is less than $Q_{cyc}$, or, otherwise, determining if a magnitude of a quantity of the SOC value subtracted by the initial SOC value is less than δ, and advancing the time step, measuring i, and repeating the operation of determining if the battery cell is in the active state or the standby state if the magnitude is equal to or greater than δ, or, otherwise, setting $Q_{loss}^{act}$ to equal $\Delta Q_{chr}$ subtracted by $\Delta Q_{dis}$.

20. The BMS of claim 19, wherein determining $\Delta Q_{chr}$ includes setting $\Delta Q_{chr}$ equal to a combination of a previous value of $\Delta Q_{chr}$ and the integration of i from the initial time to τ, if i is greater than zero or, otherwise, setting $\Delta Q_{chr}$ equal to a previous value of $\Delta Q_{chr}$ if i is less than zero.

21. The BMS of claim 20, wherein determining $\Delta Q_{dis}$ includes setting $\Delta Q_{dis}$ equal to a combination of a previous value of $\Delta Q_{dis}$ and the integration of i from the initial time to τ, if i is less than zero or, otherwise, setting $\Delta Q_{dis}$ equal to a previous value of $\Delta Q_{dis}$ if i is greater than zero.

\* \* \* \* \*